(12) United States Patent
Jiang

(10) Patent No.: US 10,418,579 B2
(45) Date of Patent: Sep. 17, 2019

(54) OLED DISPLAY DEVICE AND METHOD FOR MANUFACTURING THE SAME

(71) Applicant: Shenzhen China Star Optoelectronics Semiconductor Display Technology Co., Ltd., Shenzhen (CN)

(72) Inventor: Zhixiong Jiang, Shenzhen (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 64 days.

(21) Appl. No.: 15/569,401

(22) PCT Filed: May 3, 2017

(86) PCT No.: PCT/CN2017/082805
§ 371 (c)(1),
(2) Date: Oct. 26, 2017

(87) PCT Pub. No.: WO2018/176560
PCT Pub. Date: Oct. 4, 2018

(65) Prior Publication Data
US 2019/0051855 A1 Feb. 14, 2019

(30) Foreign Application Priority Data

Mar. 27, 2017 (CN) .......................... 2017 1 0188151

(51) Int. Cl.
*H01L 51/40* (2006.01)
*H01L 29/08* (2006.01)
(Continued)

(52) U.S. Cl.
CPC ........ *H01L 51/5092* (2013.01); *H01L 51/005* (2013.01); *H01L 51/0007* (2013.01);
(Continued)

(58) Field of Classification Search
CPC ............ H01L 51/5092; H01L 51/0007; H01L 51/005; H01L 51/5012; H01L 51/5076;
(Continued)

(56) References Cited

U.S. PATENT DOCUMENTS

2012/0032186 A1* 2/2012 Lee et al. ............ H01L 51/5036
257/76
2012/0211729 A1* 8/2012 Yamauchi .............. C09K 11/06
257/40

(Continued)

FOREIGN PATENT DOCUMENTS

CN          106129263          11/2016

OTHER PUBLICATIONS

Zhou "Study of Electrically Doped Organic Interfacial and Their Applications in Solution Processed OLEDs", A Dissertation Submitted Degree of Master, South China University of Technology, Guangzhou, China, p. 1-59, May 2014. English Abstract.

*Primary Examiner* — Alonzo Chambliss

(57) ABSTRACT

An OLED display device and a method for manufacturing the OLED display device are provided. The OLED display device comprises a substrate, a first electrode disposed on the substrate, a hole injection layer disposed on the first electrode, an organic light emitting layer disposed on the hole injection layer, an electron injection layer disposed on the organic light emitting layer, and a second electrode disposed on the electron injection layer. A material of the electron injection layer comprises an inorganic electron injecting material and an organic electron transporting material which can be dissolved in a polar solvent. The OLED display device and the method for manufacturing the OLED display device can effectively improve the electron injection efficiency for providing an excellent electron injection effect through the electron injection layer is prepared by a solution
(Continued)

in which the inorganic salt material and the organic material were mixed.

10 Claims, 3 Drawing Sheets

(51) Int. Cl.
*H01L 51/50* (2006.01)
*H01L 51/56* (2006.01)
*H01L 51/52* (2006.01)
*H01L 51/00* (2006.01)
*H01L 27/12* (2006.01)

(52) U.S. Cl.
CPC ...... *H01L 51/5012* (2013.01); *H01L 51/5076* (2013.01); *H01L 51/5206* (2013.01); *H01L 51/5221* (2013.01); *H01L 51/56* (2013.01); *H01L 27/1214* (2013.01); *H01L 51/0059* (2013.01); *H01L 51/5072* (2013.01)

(58) Field of Classification Search
CPC .. H01L 51/5206; H01L 51/5221; H01L 51/56
See application file for complete search history.

(56) References Cited

U.S. PATENT DOCUMENTS

| | | | |
|---|---|---|---|
| 2015/0357577 A1* | 12/2015 | Kim et al. | H01L 27/3211 257/40 |
| 2017/0162801 A1* | 6/2017 | Cho | H01L 51/0074 |
| 2017/0288154 A1* | 10/2017 | Seo | C07F 15/004 |
| 2018/0248136 A1* | 8/2018 | Yamaguchi | C07F 15/004 |

* cited by examiner

OLED DISPLAY DEVICE AND METHOD FOR MANUFACTURING THE SAME

RELATED APPLICATIONS

This application is a National Phase of PCT Patent Application No. PCT/CN2017/082805having International filing date of May 3, 2017, which claims the benefit of priority of Chinese Patent Application No. 201710188151.8filed on Mar. 27, 2017. The contents of the above applications are all incorporated by reference as if fully set forth herein in their entirety.

FIELD AND BACKGROUND OF THE INVENTION

This disclosure relates to an organic electroluminescent display technology, and more particularly to an OLED display device and a method for manufacturing the OLED display device.

The organic electroluminescent technology (OLED) is a new generation of display technology. Compared with the current mainstream LCD display technology, the organic electroluminescent technology has the advantages of light weight, low consumption, high response, high resolution and so on and is extensively concerned by the industry. The organic electroluminescent technology is considered to be one of the most competitive new generation flat panel display technology, and has become a hot spot in the currently research of flat panel display technology.

Depending on the different luminescent materials, the organic electroluminescent displays can be divided into two categories. One is based on organic small molecules (Small Molecule) light-emitting materials display, referred to as SmOLED, which is mainly made by a vacuum evaporation method. The other is based on polymer (Polymer) luminescent materials display, referred to as PLED, which is mainly made by a solution preparation method. Currently, the OLED products in the market are small molecule OLED made by a vacuum deposition technology. The technology leads to low material utilization, the time consuming of evaporation process, and high cost of the fine metal mask (FMM) for the evaporation process. Moreover, when used for large area evaporation, the bending of metal leads to the decrease of precision. It is difficult to get the advantage in the competition of LCD with the increasingly mature LCD technology. The technology of the solution preparation method for manufacturing the thin films with lower cost equipment, simple production process, and having a significant cost advantage, has caused more and more attentions.

In the wet-process OLED technology, since the conjugated polymer [9,9-dioctylfluorene-9,9-bis (N,N-dimethylaminopropyl) fluorene] (PFN) can be dissolved by a non-polar solvent(such as benzene, xylene, chlorobenzene, chloroform, etc.) and can also be dissolved by water or alcohol solvents (such as methanol, ethanol, etc.), PFN is usually used for electron injection layer or electron transportation layer. However, due to the electron transportation mobility of PFN is weak, it causes the electronic injection effect of the OLED device is poor.

SUMMARY OF THE INVENTION

The object of this disclosure is to provide an OLED display device and a method for manufacturing the OLED display device for solving the technical problem that the electronic injection effect of the OLED display device prepared by the solution preparation method is poor.

In order to solve the aforementioned problem, this disclosure provides an OLED display device, which comprises: a substrate, a first electrode disposed on the substrate, a hole injection layer disposed on the first electrode, an organic light emitting layer disposed on the hole injection layer, an electron injection layer disposed on the organic light emitting layer, and a second electrode disposed on the electron injection layer. A material of the electron injection layer is made by a solution comprising a solute formed by mixing an inorganic electron injecting material and an organic electron transporting material which can be dissolved in a polar solvent, and a solvent selected from water or an alcohol, wherein the organic electron-transporting material comprises [9,9-dioctylfluorene-9,9-bis (N,N-dimethylaminopropyl) fluorene].

In order to solve the aforementioned problem, this disclosure further provides an OLED display device, which comprises: a substrate, a first electrode disposed on the substrate, a hole injection layer disposed on the first electrode, an organic light emitting layer disposed on the hole injection layer, an electron injection layer disposed on the organic light emitting layer, and a second electrode disposed on the electron injection layer. A material of the electron injection layer comprises an inorganic electron injecting material and an organic electron transporting material which can be dissolved in a polar solvent.

Further, the inorganic electron injecting material comprises LiF and/or CsF, and the organic electron-transporting material comprises [9,9-dioctylfluorene-9,9-bis (N,N-dimethylaminopropyl) fluorene].

Further, a mixing ratio of the inorganic electron injecting material and the organic electron transporting material is ranged from 0.125 to 0.5.

Further, the mixing ratio of the inorganic electron injecting material and the organic electron transporting material is 0.25.

Further, the electron injection layer comprises a solvent made by a solute formed by mixing an inorganic electron injecting material and an organic electron transporting material which can be dissolved in a polar solvent, and a solvent selected from water or an alcohol, and wherein a mixing ratio of the solute and the solvent in the solution is ranged from 0.1% to 0.2%.

This disclosure further provides a method for manufacturing a OLED display device, the method comprises the following steps of:

providing a substrate and forming a first electrode on the substrate;

coating or vapor-depositing a hole injection layer and an organic light emitting layer on the first electrode in turn;

coating an electron injection layer on the organic light emitting layer by a wet film forming process, wherein a material of the electron injection layer comprises an inorganic electron injecting material and an organic electron transporting material which can be dissolved in a polar solvent; and forming a second electrode on the electron injection layer.

Further, the inorganic electron injecting material comprises LiF and/or CsF, and the organic electron-transporting material comprises [9,9-dioctylfluorene-9,9-bis (N,N-dimethylaminopropyl) fluorene].

Further, a mixing ratio of the inorganic electron injecting material and the organic electron transporting material is ranged from 0.125 to 0.5.

Further, the mixing ratio of the inorganic electron injecting material and the organic electron transporting material is 0.25.

Further, the electron injection layer is made by a solution comprising a solute formed by mixing an inorganic electron injecting material and an organic electron transporting material which can be dissolved in a polar solvent, and a solvent selected from water or an alcohol, and wherein a mixing ratio of the solute and the solvent in the solution is ranged from 0.125 to 0.5.

This disclosure has the advantageous effects as follows. The OLED display device and a method for manufacturing the OLED display device of this disclosure disclose that the OLED display device comprises a substrate, a first electrode disposed on the substrate, a hole injection layer disposed on the first electrode, an organic light emitting layer disposed on the hole injection layer, an electron injection layer disposed on the organic light emitting layer, and a second electrode disposed on the electron injection layer. A material of the electron injection layer comprises an inorganic electron injecting material and an organic electron transporting material which can be dissolved in a polar solvent. The OLED display device and the method for manufacturing the OLED display device can effectively improve the electron injection efficiency for providing an excellent electron injection effect through the electron injection layer is prepared by a solution in which the inorganic salt material and the organic material were mixed.

BRIEF DESCRIPTION OF THE SEVERAL VIEWS OF THE DRAWINGS

The accompanying drawings are made for the purpose of illustrating the general principles of this disclosure and are used to describe and understand the advantageous effects of this disclosure, obviously.

DESCRIPTION OF SPECIFIC EMBODIMENTS OF THE INVENTION

Detailed example embodiments are disclosed herein. However, specific structural and/or functional details disclosed herein are merely representative for purposes of describing example embodiments. The claims may, however, may be embodied in many alternate forms and should not be construed as limited to only example embodiments set forth herein.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items. It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Figure 1:
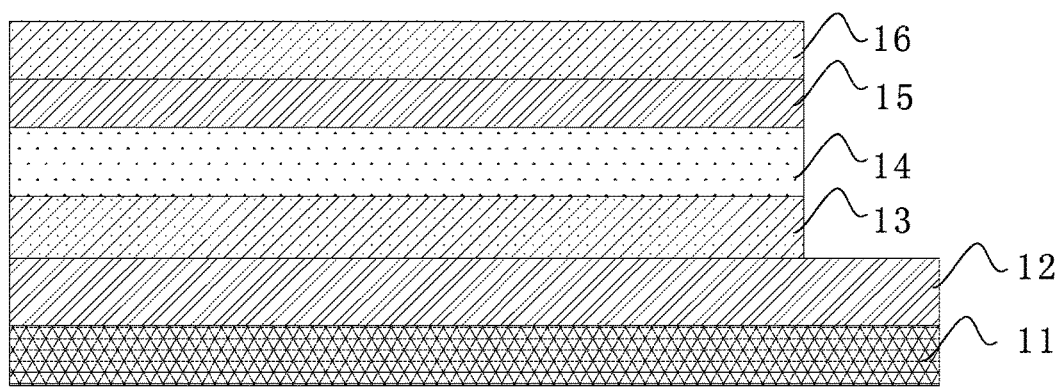
FIG. 1 is a structural schematic view of an OLED display device according to this disclosure.

Refer to FIG. 1, this disclosure provides an OLED display device, which comprises a substrate 11, a first electrode 12 disposed on the substrate 11, a hole injection layer 13 disposed on the first electrode 12, an organic light emitting layer 14 disposed on the hole injection layer 13, an electron injection layer 15 disposed on the organic light emitting layer 14, and a second electrode 16 disposed on the electron injection layer 15. A material of the electron injection layer 15 comprises an inorganic electron injecting material and an organic electron transporting material which can be dissolved in a polar solvent.

Specifically, the substrate 11 is a TFT array substrate 11. The first electrode 12 is a transparent pixel electrode on the TFT array substrate 11. The first electrode 12 is an anode, and the second electrode 16 is a cathode. The first electrode 12 is typically formed of a conductive material having a relatively high electrical conductivity function, such as indium tin oxide (ITO) or silver (Ag). The first electrode 12 may be a two-layer structure. For example, the first electrode 12 can include a first layer formed of a high reflectivity metal material, such as aluminum (Al) or an aluminum alloy, for improving a light emitting efficiency, and a second layer formed of a transparent conductive material having the relatively high electrical conductivity function such as indium tin oxide (ITO) or silver (Ag). The hole injection layer 13 is used for smoothly injecting holes from the first electrode 12 into the organic light emitting layer 14. A material of the hole injection layer 13 is selected and prepared from at least of the group consisting of CuPc (copper phthalocyanine), PEDOT (poly (3,4)-ethyloxy dioxythiophene), PANI (polyaniline) and NPD (N,N-di-naphthyl-N,N'-diphenyl Aniline). Preferably, the material of the hole injection layer 13 includes PEDOT: PSS, and PSS is polystyrene sulfonate. These two substances are mixed together to greatly improve the solubility of PEDOT. The material of the organic light emitting layer 14 may include an organic small molecule fluorescent material, an organic polymer fluorescent material, a small molecule phosphorescent material, or a polymer phosphorescent material.

In the embodiment of this disclosure, the electron injection layer 15 is used to smoothly inject electrons. The organic electron-transporting material comprises [9,9-dioctylfluorene-9,9-bis (N,N-dimethylaminopropyl) fluorene] (PFN). It is mainly because that PFN can be dissolved in non-polar solvents (such as benzene, xylene, chlorobenzene, chloroform, etc.), and can also be dissolved in water or alcohol and other polar solvents (such as methanol, ethanol, etc.), and also has a certain degree ability of electronic injection with the high-function metal.

The inorganic electron injecting material mainly comprises a metal compound which may include an alkali metal or alkaline earth metal, such as at least one of LiQ, LiF, NaF, KF, RbF, CsF, FrF, BeF2, MgF2, CaF2, SrF2, BaF2 and RaF2. Preferably, the inorganic electron injecting material comprises LiF and/or CsF. The electron injection layer is made by a solution comprising a solute formed by mixing an inorganic electron injecting material and an organic electron transporting material which can be dissolved in a polar solvent, and a solvent selected from water or an alcohol, wherein a mixing ratio of the solute and the solvent in the solution is ranged from 0.1% to 0.2%. A mixing ratio of the inorganic electron injecting material and the organic electron transporting material is ranged from 0.125 to 0.5. Moreover, the optimum mixing ratio of the inorganic electron injecting material and the organic electron transporting material is 0.25 (i.e., 1:4).

It is to be understood that in the wet film forming process, it can form a good solution consisting of organic material and inorganic material mixed therein by mixing an inorganic electron injecting material, such as LiF and CsF, with a PFN-based organic electron transporting material soluble in a hydro-alcoholic solvent. That not only overcomes the drawbacks, such as strong crystallinity, nonuniform film after crystallization, poor adhesion of LiF and CsF inorganic salts, but also overcomes the drawbacks of weak migration ability of PFN, thereby manufacturing a uniform film. The electronic injection effect is good to enhance the conducive of the device. On the other hand, the range of materials for solution processing can be extended, and the application range of wet film forming processes (such as ink-jet printing) can be improved.

Figure 2:
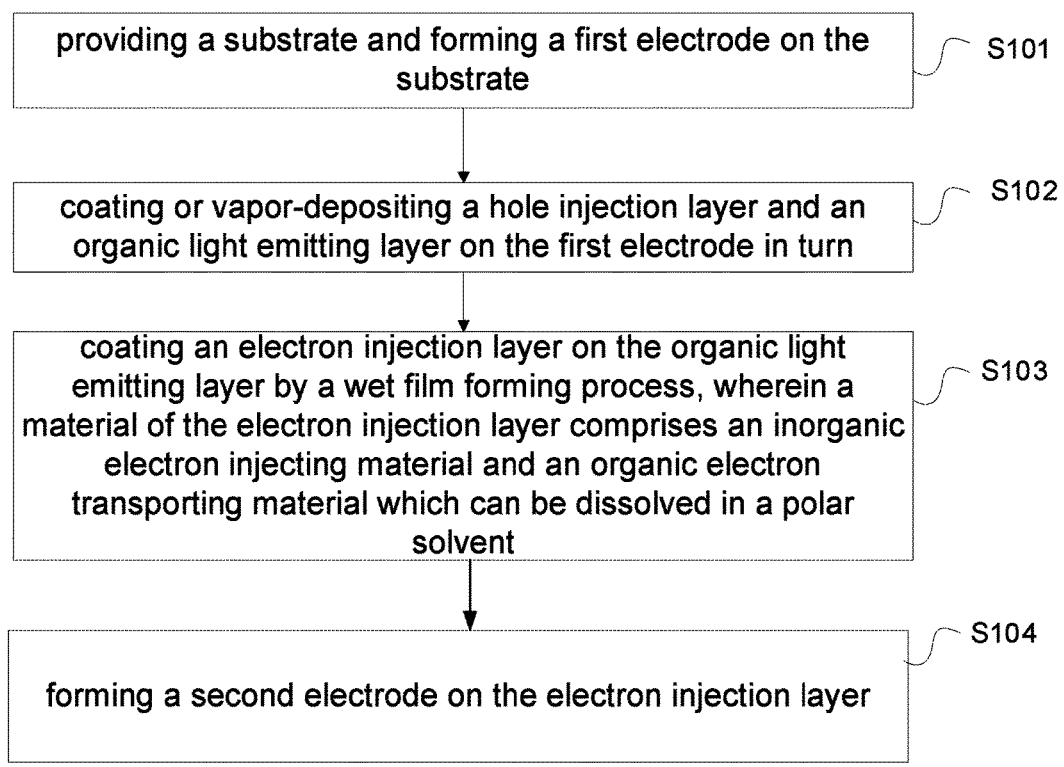
FIG. 2 is a flowchart of the step of a method for manufacturing the OLED display device according to this disclosure.

Moreover, refer to FIG. 2, This disclosure further provides a method for manufacturing a OLED display device, the method comprises the following steps.

In a step S101, providing a substrate 11 is provided and a first electrode 12 is formed on the substrate 11.

In the present embodiment, the substrate 11 is usually glass, and a first electrode 12 is manufactured on the substrate 11 by sputtering or vapor deposition. The first electrode 12 may be an anode, and the material of the anode may include ITO.

In a step S102, a hole injection layer 13 and an organic light emitting layer 14 are coated or vapor-deposited on the first electrode 12 in turn.

In the present embodiment, the ITO substrate 11 may be cleaned and dried, and then the hole injection layer 13 and the organic light emitting layer 14 may be formed on the ITO substrate 11 by a wet film forming process or a vapor deposition process.

In the present embodiment, the ITO substrate 11 can be cleaned and dried, and then the hole injection layer 13 and the organic light emitting layer 14 are formed on the ITO substrate 11 by a wet film forming process or a vapor deposition process. When the manufacturing process is the wet film forming process, the material of the hole injection layer 13 includes PEDOT:PSS. Besides, PSS is polystyrene sulfonate, and PEDOT is (poly (3,4) Thiophene). The material of the organic light emitting layer 14 includes an organic small molecule fluorescent material, an organic polymer fluorescent material, a small molecule phosphorescent material, or a polymer phosphorescent material.

In a step S103, an electron injection layer 15 is coated on the organic light emitting layer 14 by a wet film forming process. A material of the electron injection layer 15 comprises an inorganic electron injecting material and an organic electron transporting material which can be dissolved in a polar solvent.

Figure 3:
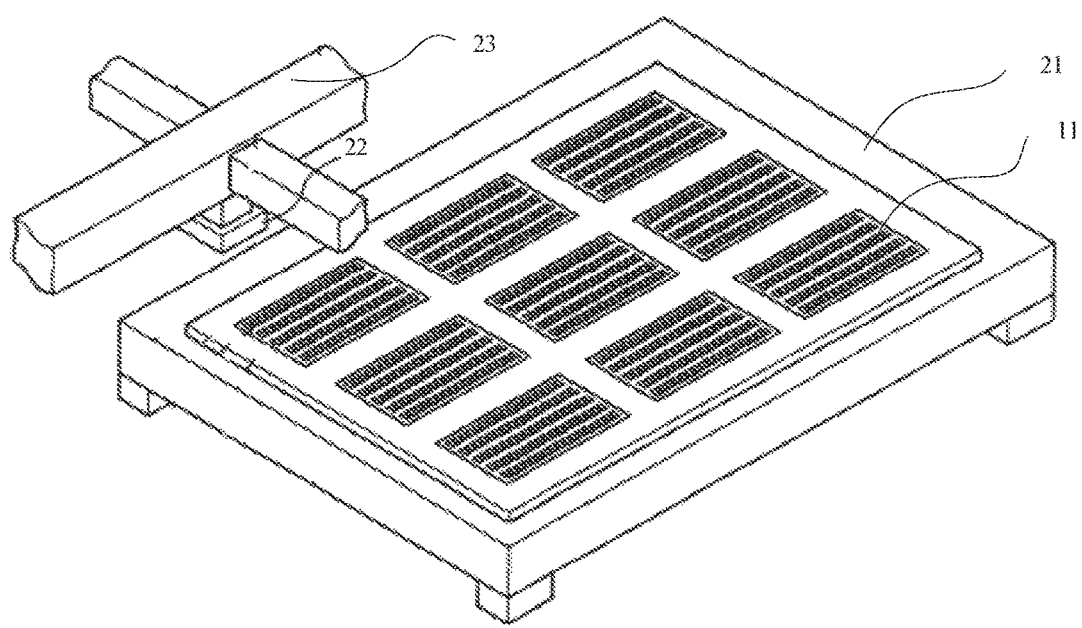
FIG. 3 is a structural schematic view of an inkjet printing system according to this disclosure.

In the present embodiment, the electron injection layer comprises is made by a solution comprising a solute formed by mixing an inorganic electron injecting material and an organic electron transporting material which can be dissolved in a polar solvent, and a solvent selected from water or an alcohol, wherein a mixing ratio of the solute and the solvent in the solution is ranged from 0.1% to 0.2%. A mixing ratio of the inorganic electron injecting material and the organic electron transporting material is ranged from 0.125 to 0.5. Moreover, the optimum mixing ratio of the inorganic electron injecting material and the organic electron transporting material is 0.25 (i.e., 1:4). The inorganic electron injecting material comprises LiF and/or CsF. The organic electron-transporting material comprises PFN. Refer to FIG. 3, the electron injection layer 15 can be prepared by an ink jet printing system. The ink jet printing system comprises a workbench 21, a printhead 22, and a printhead moving device 23. The substrate 11 is fixed to the workbench 21. The mixed solution of the electron injection layer 15 is accommodated in the printhead 22. When the printhead moving device 23 controls the printhead 22 moving at constant speed, the mixed solution is dropped from the printhead 22 onto the substrate 11.

In a step S104, a second electrode 16 is formed on the electron injection layer 15.

In the present embodiment, the second electrode 16 is a cathode, and the material of the cathode includes a metal such as Al, Mg or Ca, or an alloy, which is prepared by sputtering or vapor deposition.

The OLED display device and the method for manufacturing the OLED display device of this disclosure disclose that the OLED display device comprises a substrate 11, a first electrode 12 disposed on the substrate 11, a hole injection layer 13 disposed on the first electrode 12, an organic light emitting layer 14 disposed on the hole injection layer 13, an electron injection layer 15 disposed on the organic light emitting layer 14, and a second electrode 16 disposed on the electron injection layer 15. A material of the electron injection layer 15 comprises an inorganic electron injecting material and an organic electron transporting material which can be dissolved in a polar solvent. The OLED display device and the method for manufacturing the OLED display device can effectively improve the electron injection efficiency and enhance the efficiency of the OLED display device for providing an excellent electron injection effect through the electron injection layer 15 is prepared by a solution in which the inorganic salt material and the organic material were mixed. Moreover, the selectable range of the materials for wet film forming processes can be expanded, and the application range of the ink-jet printing method can be increased.

This disclosure has been described with preferred embodiments thereof, and it is understood that many changes and modifications to the described embodiment can be carried out without departing from the scope and the spirit of the invention that is intended to be limited only by the appended claims.

What is claimed is:
1. An OLED display device, comprising:
a substrate;
a first electrode disposed on the substrate;
a hole injection layer disposed on the first electrode;
an organic light emitting layer disposed on the hole injection layer;
an electron injection layer disposed on the organic light emitting layer; and
a second electrode disposed on the electron injection layer;
wherein a material of the electron injection layer is made by a solution comprising a solute formed by mixing an inorganic electron injecting material with an organic electron transporting material which can be dissolved in a polar solvent, and a solvent selected from water or an alcohol; and wherein the organic electron-transporting material comprises [9,9-dioctylfluorene-9,9-bis (N, N-dimethylaminopropyl) fluorene].

2. The OLED display device according to claim 1, wherein the inorganic electron injecting material comprises LiF and/or CsF.

3. The OLED display device according to claim 1, wherein a mixing ratio of the inorganic electron injecting material and the organic electron transporting material is ranged from 0.125 to 0.5.

4. The OLED display device according to claim 3, wherein the mixing ratio of the inorganic electron injecting material and the organic electron transporting material is 0.25.

5. The OLED display device according to claim 1, wherein a mixing ratio of the solute and the solvent in the solution is ranged from 0.1% to 0.2%.

6. The OLED display device according to claim 1, wherein the electron injection layer is made by a solution comprising a solute formed by mixing an inorganic electron injecting material and an organic electron transporting material which can be dissolved in a polar solvent, and a solvent selected from water or an alcohol, and wherein a mixing ratio of the solute and the solvent in the solution is ranged from 0.1% to 0.2%.

7. An OLED display device, comprising:
a substrate;
a first electrode disposed on the substrate;
a hole injection layer disposed on the first electrode;
an organic light emitting layer disposed on the hole injection layer;
an electron injection layer disposed on the organic light emitting layer; and
a second electrode disposed on the electron injection layer;
wherein a material of the electron injection layer comprises an inorganic electron injecting material and an organic electron transporting material which can be dissolved in a polar solvent.

8. The OLED display device according to claim 7, wherein the inorganic electron injecting material comprises LiF and/or CsF, and the organic electron-transporting material comprises [9,9-dioctylfluorene-9,9-bis (N, N-dimethylaminopropyl) fluorene].

9. The OLED display device according to claim 7, wherein a mixing ratio of the inorganic electron injecting material and the organic electron transporting material is ranged from 0.125 to 0.5.

10. The OLED display device according to claim 9, wherein the mixing ratio of the inorganic electron injecting material and the organic electron transporting material is 0.25.

* * * * *